(12) United States Patent
Hayashi (10) Patent No.: US 8,283,606 B2
(45) Date of Patent: Oct. 9, 2012

(54) SUBSTRATE PROCESSING APPARATUS AND SUBSTRATE STAGE USED THEREIN

(75) Inventor: Daisuke Hayashi, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 1100 days.

(21) Appl. No.: 12/186,103

(22) Filed: Aug. 5, 2008

(65) Prior Publication Data

US 2009/0078694 A1     Mar. 26, 2009

Related U.S. Application Data

(60) Provisional application No. 60/991,826, filed on Dec. 3, 2007.

(30) Foreign Application Priority Data

Sep. 20, 2007 (JP) ................. 2007-244462

(51) Int. Cl.
*H05B 3/06* (2006.01)
*H05B 3/36* (2006.01)
*H05B 3/68* (2006.01)
*F27B 5/06* (2006.01)
*F27B 5/14* (2006.01)
*H01L 21/02* (2006.01)
*H01L 21/67* (2006.01)
*H01L 21/683* (2006.01)

(52) U.S. Cl. ............ 219/444.1; 219/390; 392/418; 118/728

(58) Field of Classification Search ............. None
See application file for complete search history.

(56) References Cited

U.S. PATENT DOCUMENTS

| | | | | | |
|---|---|---|---|---|---|
| 5,443,648 | A | * | 8/1995 | Ohkase | 118/724 |
| 5,759,281 | A | * | 6/1998 | Gurary et al. | 118/725 |
| 5,972,116 | A | * | 10/1999 | Takagi | 118/719 |
| 6,294,025 | B1 | * | 9/2001 | Kinder | 118/641 |
| 6,688,375 | B1 | * | 2/2004 | Turner et al. | 165/48.1 |
| 7,645,342 | B2 | * | 1/2010 | Emerson et al. | 118/725 |
| 8,071,920 | B2 | * | 12/2011 | Shimanuki et al. | 219/443.1 |
| 2006/0130763 | A1 | * | 6/2006 | Emerson et al. | 118/725 |
| 2007/0138161 | A1 | | 6/2007 | Yamakawa | |
| 2010/0101495 | A1 | * | 4/2010 | Emerson et al. | 118/725 |

FOREIGN PATENT DOCUMENTS

JP   2003-59788    2/2003
JP   2005-166830   6/2005

* cited by examiner

*Primary Examiner* — Joseph M Pelham
(74) *Attorney, Agent, or Firm* — Oblon, Spivak, McClelland, Maier & Neustadt, L.L.P.

(57) ABSTRACT

A substrate stage includes a stage upon which a wafer is placed, a heater element installed within the stage, an upright support that ranges upright from a bottom of a processing chamber and includes a tubular member that includes a small tube portion, a large tube portion and a middle portion attached to and joins the small tube portion and the large tube portion to one another, an outer heat shield plate disposed so as to surround the outer side of the small tube portion and an inner heat shield plate. The outer heat shield plate and the inner heat shield plate are disposed so that an inner edge of the outer heat shield plate and an outer edge of the inner heat shield plate overlap along the entire circumference.

7 Claims, 8 Drawing Sheets

SUBSTRATE PROCESSING APPARATUS AND SUBSTRATE STAGE USED THEREIN

CROSS-REFERENCE TO RELATED APPLICATIONS

This document claims priority to Japanese Patent Application Number 2007-244462, filed on Sep. 20, 2007 and U.S. Provisional Application No. 60/991,826, filed on Dec. 3, 2007, the entire content of which are hereby incorporated by reference.

FIELD OF THE INVENTION

The present invention relates to a substrate processing apparatus that executes heat treatment on a substrate such as a semiconductor wafer or an FPD substrate or a specific type of processing such as CVD while heating the substrate, and it also relates to a substrate stage used in the substrate processing apparatus.

BACKGROUND OF THE INVENTION

During a semiconductor device manufacturing process, various types of gas processing such as film formation processing and etching are executed on a substrate, which may be a semiconductor wafer (hereafter simply referred to as a "wafer"). During such processing, a specific film present on the wafer may be selectively removed through etching by using a resist film formed on the surface of the substrate as a mask and the resist film may then be removed through ashing. A substrate processing apparatus that executes an ashing process normally includes a stage with a built-in heater disposed inside a processing chamber thereof and ashes the wafer on the stage by supplying an electrical current to the heater to heat the wafer to a high temperature of, for instance, 400° C. or higher.

The heater built into the stage may be, for instance, an infrared heater that heats the wafer placed on the stage with radiant heat (infrared rays). As the wafer is heated with the heater, the heat originating from the heater is directly conducted to members constituting the heater, raising the temperature of the stage as well. Thus, if the stage is installed directly at the bottom of the processing chamber, the heat at the stage is conducted to the bottom of the processing chamber, giving rise to a concern that components disposed at the bottom with a lower level of heat resistance (e.g., an O-ring, a sensor and an electrical wiring) may be adversely affected. In order to inhibit heat transfer as the heat is conducted from the stage to the bottom of the processing chamber, a cooling mechanism for cooling the bottom area inside the processing chamber may be installed as disclosed in patent reference literature 1 listed below. However, the installation of such a cooling mechanism in the processing chamber will complicate the structure and the manufacturing cost will also increase. In other words, it is more desirable to address the issue by maintaining structural simplicity without installing a cooling mechanism or the like.

Figure 8:
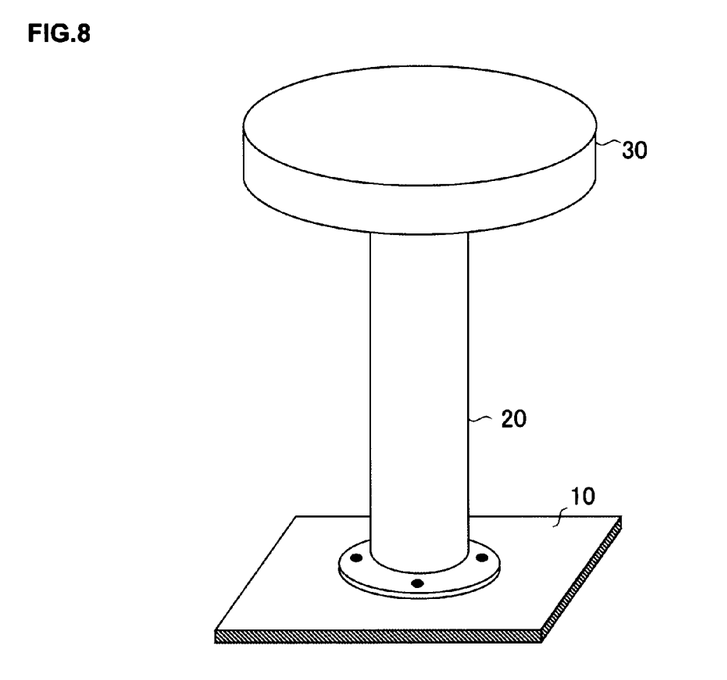
FIG. 8 illustrates the structure of a substrate stage supported on an upright support in the related art.

For instance, a stage 30 may be set away from a bottom area 10 of the processing chamber, as shown in FIG. 8, by installing an upright support 20, constituted of a material having a low coefficient of thermal conductivity, which ranges upright from the bottom 10 of the processing chamber and supports the stage 30. However, while the components may be protected from the heat from stage 30 simply by supporting the stage 30 on the upright support 20, they may still be adversely affected by infrared rays (radiant heat) originating from the heater. Namely, since the infrared rays (radiant heat) from the heater are radiated towards the bottom 10 of the processing chamber present below the stage, as well as the substrate set above the heater, the bottom area 10 of the processing chamber, too, may become heated.

The extent to which the bottom area 10 of the processing chamber becomes heated with radiant heat may be minimized by installing an upright support 20 so as to set apart the stage from the bottom 10 of the processing chamber over a greater distance. However, the use of such a long upright support will necessitate an increase in the size of the processing chamber and this is not desirable. In addition, since the intensity of the infrared rays from the heater rises as a higher target temperature is selected for the substrate, the height of the upright support, too, will have to be correspondingly increased and an increase in the size of the processing chamber becomes necessary.

Since it is definitely undesirable to increase the size of the processing chamber, the length of the upright support 20 may be minimized by, for instance, installing a heat shield plate 40 between the stage 30 and the bottom 10 of the processing chamber so as to block the infrared rays from the heater at the heat shield plate 40 and thus reduce the quantity of infrared rays reaching the bottom 10 of the processing chamber.

Figure 9:
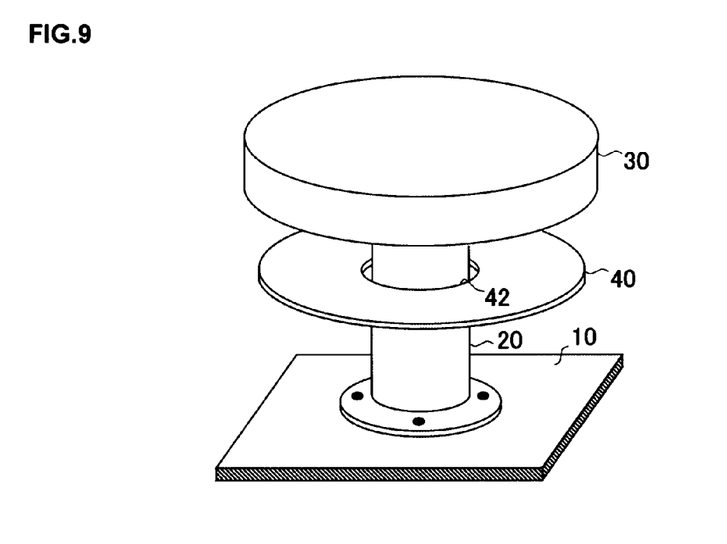
FIG. 9 illustrates a structure that includes a shield plate installed in conjunction with the substrate stage shown in FIG. 8.

However, the structure in which the stage is supported on the upright support imposes certain restrictions with regard to the installation of the heat shield plate, i.e., the heat shield plate must be installed so as not to interfere with the upright support, e.g., by installing the heat shield plate so as to surround the upright support. In the example presented in FIG. 9, an insertion hole 42 is formed in the heat shield plate 40 and the upright support 20 is inserted through the insertion hole 42. In this case, a gap is formed between the upright support 20 and the insertion hole 42 at the heat shield plate 40. The infrared rays originating from the heater may be transmitted through even a small gap formed between the upright support and the insertion hole to reach the bottom area 10 of the processing chamber. It is to be noted that a similar phenomenon will occur when a power supply electrode is connected to the lower side of the heater, with a reflector installed further downward relative to the heater, as in the case of the stage disclosed in patent reference literature 2 listed below. Namely, a gap is formed between the electrode and the hole formed at the reflector through which the electrode is inserted and the infrared rays from the heater may thus be transmitted through the gap to reach the bottom of the processing chamber and heat the bottom area unnecessarily in the processing chamber equipped with a stage disclosed in patent reference literature 2 listed below.

Furthermore, the stage upright support in the substrate processing apparatus in which the wafer is heated to a high temperature as described above is often constituted with a material having a high level of heat resistance, e.g., quartz. However, a highly heat resistant material such as quartz itself tends to readily transmit infrared rays. For this reason, even if the reflector is installed without forming any gap between the reflector and the upright support constituted of quartz or the like, the infrared rays from the heater will be transmitted through the upright support itself to reach the bottom of the processing chamber and the bottom area of the processing chamber will be heated unnecessarily.

Patent reference literature 1: Japanese Laid Open Patent Publication No. 2003-059788

Patent reference literature 2: Japanese Laid Open Patent Publication No. 2005-166830

SUMMARY OF THE INVENTION

Accordingly, an object of the present invention having been completed by addressing the issues discussed above, is to provide a substrate processing apparatus that prevents unnecessary heating of the bottom area of the processing chamber by tightly shielding the bottom area of the processing chamber from infrared rays (radiant heat) from the heater toward the bottom of the processing chamber without having to adjust the length of the upright support supporting a substrate stage and also to provide an optimal a substrate stage to be installed in the substrate processing apparatus.

The object of the present invention is achieved in an aspect of the present invention by providing a substrate processing apparatus that includes a substrate stage installed inside a processing chamber and executes a specific type of processing on a substrate placed on the substrate stage. The substrate stage in the substrate processing apparatus comprises a stage upon which the substrate is placed, a heater installed inside the stage and heats the substrate placed on the stage, an upright support that ranges upright from the bottom of the processing chamber to support the stage and is constituted with a tubular member that includes a small tube portion, a large tube portion assuming an inner diameter greater than the outer diameter of the small tube portion and a middle portion present between the small tube portion and the large tube portion, an outer heat shield plate disposed so as to surround the small tube portion on the outer side thereof, and blocks the heat from the heater on the outer side of the small tube portion and an inner heat shield plate disposed so as to close off an inner side of the large tube portion, and blocks the heat from the heater on the inner side of the large tube portion. The outer heat shield plate and the inner heat shield plate are disposed so that an inner edge of the outer heat shield plate and an outer edge of the inner heat shield plate overlap along the entire circumference, in a plan view taken from the stage. The upright support may be constituted with a tubular member with the small tube portion thereof connected to the stage and the large tube portion thereof connected to the bottom of the processing chamber, or the upright support may be constituted with a tubular member with the large tube portion thereof connected to the stage and the small tube portion thereof connected to the bottom of the processing chamber.

The object described above is also achieved in another aspect of the present invention by providing a substrate stage upon which a substrate to undergo a specific type of processing inside a processing chamber is placed. The substrate stage comprises a stage upon which the substrate is placed, a heater installed inside the stage and heats the substrate placed on the stage, an upright support that ranges upright from the bottom of the processing chamber to support the stage and is constituted with a tubular member that includes a small tube portion, a large tube portion assuming an inner diameter greater than the outer diameter of the small tube portion and a middle portion present between the small tube portion and the large tube portion, an outer heat shield plate disposed so as to surround the small tube portion along the outer side thereof, and blocks the heat from the heater on the outer side of the small tube portion and an inner heat shield plate disposed so as to close off an inner side of the large tube portion, which blocks the heat from the heater on the inner side of the large tube portion. The outer heat shield plate and the inner heat shield plate are disposed so that an inner edge of the outer heat shield plate and an outer edge of the inner heat shield plate overlap along the entire circumference, in a plan view taken from the stage.

According to the present invention described above, in which the upright support supporting the stage is constituted with a tubular member that includes a small tube portion and a large tube portion and the outer heat shield plate and the inner heat shield plate are disposed so that the inner edge of the outer heat shield plate disposed on the outer side of the small tube portion and the outer edge of the inner heat shield plate disposed on the inner side of the large tube portion overlap, the heat shield plates can be installed without creating any gap in a plan view taken from the stage. As a result, infrared rays from the stage and directed towards the bottom area inside the processing chamber as the heater emits heat, can be completely blocked via the outer heat shield plate and the inner heat shield plate. Ultimately, unnecessarily heat application to the bottom area of the processing chamber is prevented without having to adjust the length of the upright support supporting the stage.

In addition, since the outer diameter of the large tube portion is greater than the inner diameter of the small tube portion, the area of the small diameter portion with a large wall thickness and the area of the large tube portion with a large wall thickness are offset relative to each other in the plan view, with the outer heat shield plate or the inner heat shield plate always present at the large wall thicknesses areas of the small tube portion and the large tube portion without fail in the plan view. While infrared rays from the heater are likely to travel through the large wall thickness areas of the small tube portion and the large tube portion if the tubular member is constituted of quartz or the like, the infrared rays will mostly be transmitted directly downward due to a very pronounced tendency of infrared rays to advance through rectilinear propagation and thus, most of the infrared rays can be blocked at the outer heat shield plate or the inner heat shield plate. In other words, the infrared rays passing through the large wall thickness area of the small tube portion or the large wall thickness area of the large tube portion can be effectively blocked.

The tubular member may be formed by molding the small tube portion, the middle portion and the large tube portion as an integrated unit. In such a case, the tubular member can be formed through a simple process. Alternatively, a member to constitute the small tube portion and a member to constitute the large tube portion, provided as separate members, may be connected via a member to constitute the middle portion. In this case, a tubular member assuming a shape that cannot be formed readily through integral molding of the small tube portion, the middle portion and the large tube portion as an integrated unit can be obtained with ease.

An end of the small tube portion and an end of the large tube portion are connected at the middle portion so that the middle portion ranges in a continuous tapered shape. The diameter of the middle portion may be smallest at the end of the small tube portion and gradually increase downward toward the end of the large tube portion or the diameter may gradually increase upward. In addition, an end of the small tube portion and an end of the large diameter may be connected at a middle portion ranging continuously along the horizontal direction. This positional arrangement allows the large wall thickness area of the small tube portion and the large wall thickness area of the large tube portion to be set without overlapping in the plan view and, as a result, it is ensured that the outer heat shield plate or the inner heat shield plate is always present at the large wall thickness areas of the small tube portion and the large tube portion in the plan view.

The outer heat shield plate and the inner heat shield plate may each be constituted with a plurality of plates stacked one on top of the other so as to enhance the effect with which they block infrared rays (radiant heat) from the heater.

According to the present invention, infrared rays (radiant heat) originating from the heater and directed toward the bottom of the processing chamber are completely blocked and thus, unnecessary heat application to the bottom area of the processing chamber is prevented without having to adjust the length of the upright support supporting the stage.

DETAILED DESCRIPTION OF THE PREFERRED EMBODIMENTS

The following is a detailed explanation of the preferred embodiments of the present invention, given in reference to the attached drawings. It is to be noted that in the description and the drawings, the same reference numerals are assigned to components having substantially identical functions and structural features to preclude the necessity for a repeated explanation thereof.

Figure 1:
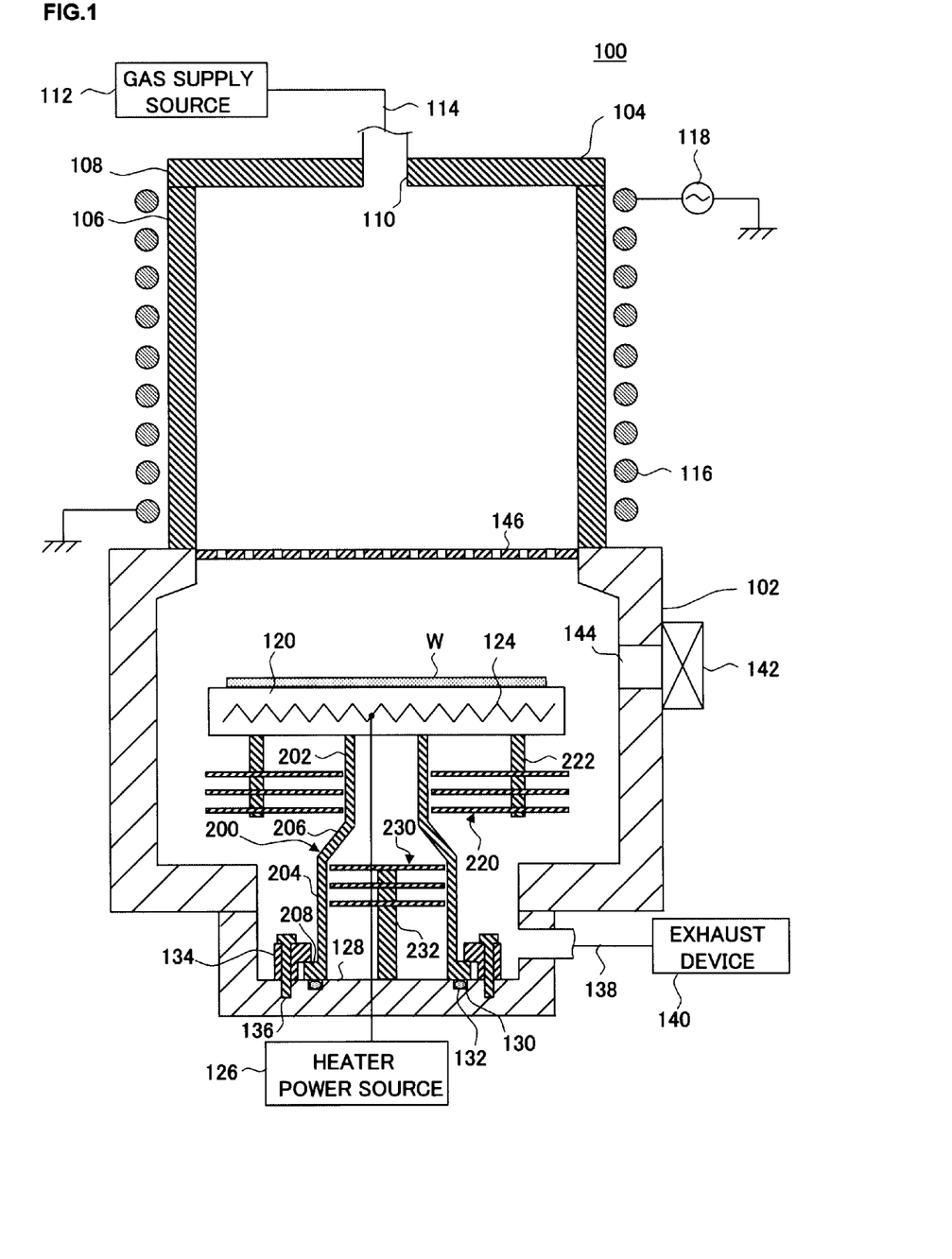
FIG. 1 is a longitudinal sectional view presenting a structural example that may be adopted in the plasma processing apparatus achieved in a first embodiment of the present invention.

Structural Example for the Plasma Processing Apparatus Achieved in the First Embodiment First, in reference to a drawing, a structural example that may be adopted in a substrate processing apparatus that includes the substrate stage achieved in the first embodiment of the present invention is explained. The following explanation is provided by assuming that the present invention is adopted in a down-flow type plasma processing apparatus that processes substrates by using hydrogen radicals generated from plasma (hereafter may be referred to as "hydrogen plasma") raised from a hydrogen-containing processing gas. FIG. 1 is a longitudinal sectional view schematically illustrating the structure of a plasma processing apparatus 100 achieved in the first embodiment. In the plasma processing apparatus 100, a photoresist film formed on a low dielectric constant insulating film with a lower dielectric constant is removed through ashing by supplying hydrogen radicals over to a wafer W having the lower dielectric constant insulating film, such as a low-k film, formed thereupon.

As shown in FIG. 1, the plasma processing apparatus 100 includes a processing chamber 102 where the wafer W is processed and a plasma generation chamber 104 communicating with the processing chamber 102, where plasma is generated by exciting a processing gas. The plasma generation chamber 104, located above the processing chamber 102, is structured so that plasma is generated through an inductively coupled plasma method from the processing gas delivered thereto.

More specifically, the plasma generation chamber 104 includes a substantially cylindrical reaction container 106 constituted of an insulating material such as quartz or ceramic. The top of the reaction container 106 is sealed off with a detachable lid 108 so as to assure a high level of airtightness. A gas delivery port 110 is formed at the lid 108 and a specific type of processing gas originating from a gas supply source 112 is delivered into the internal space of the plasma generation chamber 104 via the gas delivery port 110. Although not shown, a switching valve via which a gas piping 114 is opened/closed, a mass flow controller that regulates the flow rate of the processing gas and the like are disposed at the gas piping 114 connecting the gas supply source 112 to the gas delivery port 110.

The processing gas is a hydrogen-containing gas with which hydrogen radicals (H*) can be generated. Such a processing gas may be constituted with hydrogen gas alone or it may be a mixed gas containing hydrogen gas and an inert gas. The inert gas in the mixed gas may be, for instance, helium gas, argon gas or neon gas. It is to be noted that when a mixed gas containing hydrogen gas and an inert gas is used as the processing gas, the hydrogen gas should be mixed with a mixing ratio of, for instance, 4%.

A coil 116 to be used as an antenna member is wound around the outer circumference of the reaction container 106. A high-frequency power source 118 is connected to the coil 116. High-frequency power with its frequency set in a range of 300 kHz~60 MHz can be output from the high-frequency power source 118. As high-frequency power with a frequency of, for instance, 450 kHz is supplied from the high-frequency power source 118 to the coil 116, an induction field is formed inside the plasma generation chamber 104. As a result, the processing gas delivered into the plasma generation chamber 104 becomes excited and is raised to plasma.

At the bottom of the processing chamber 102 constituted of, for instance, aluminum, the substrate stage in the embodiment is installed. The substrate stage achieved in the embodiment includes a stage 120 upon which a wafer is placed and an upright support 200 that ranges upright from the bottom of the processing chamber and supports the stage. The stage 120, assuming a disk shape, supports the wafer W in a level attitude and is constituted of a material having a high level of heat resistance and does not induce metal contamination, such as quartz. In addition, a heater element (ohmic heater) 124, which heats the wafer W, is embedded in the stage 120, and as power is supplied to the heater element 124 from a heater power source 126, the wafer W is heated to a predetermined temperature (e.g., 400° C.). It is to be noted that the wafer W can be heated to a specific temperature equal to or higher than 400° C. or equal to or higher than 600° C. by modifying the structure of the heater element 124. It is to be noted that examples of specific structures that may be adopted for the substrate stage are to be described later.

An exhaust device 140 that includes a vacuum pump is connected to the processing chamber 102 via an exhaust pipe 138. As the exhaust device 140 is engaged in operation, the pressure in the processing chamber 102 and the plasma generation chamber 104 can be lowered to achieve a predetermined degree of low pressure.

At the side wall of the processing chamber 102, a transfer port 144 that can be opened/closed via a gate valve 142 is formed. The wafer W is carried into/out of the processing chamber via a transfer mechanism such as a transfer arm (not shown).

The edge of the open bottom of the reaction container 106 at the plasma generation chamber 104 is set at the edge of the open top of the processing chamber 102. Near the position at which the reaction container is mounted at the processing chamber, a barrier wall member 146 is detachably installed so as to separate the processing chamber 102 from the plasma generation chamber 104. The barrier wall member 146 is structured so that only hydrogen radicals generated as the hydrogen-containing processing gas is excited to plasma in the plasma generation chamber 104, are allowed to pass through the barrier wall member.

A wafer W to be processed with hydrogen radicals in the plasma processing apparatus 100 structured as described above is first carried into the processing chamber 102 through the transfer port 144 by opening the gate valve 142. Once the wafer W is placed in the processing chamber 102, it is transferred onto the stage 120.

Subsequently, the gate valve 142 is closed and the processing chamber 102 and the plasma generation chamber 104 are evacuated via the exhaust device 140 until the pressure inside is reduced to a predetermined degree of low pressure. In addition, the power is supplied from the heater power source 126 to the heater element 124 so as to heat the wafer W to a predetermined temperature (e.g., 400° C.).

Then, high-frequency power (e.g., 4000 W) is supplied to the coil 116 from the high-frequency power source 118 while supplying the processing gas constituted with a hydrogen-containing gas from the gas supply source 112 into the plasma generation chamber 104 via the gas delivery port 110, thereby forming an induction field inside the plasma generation chamber 104 and consequently generating hydrogen plasma inside the plasma generation chamber 104. From the hydrogen plasma, ultraviolet light, hydrogen ions and hydrogen radicals are formed. Of these, the ultraviolet light and the hydrogen ions are blocked at the barrier wall member 146 and the hydrogen radicals alone are allowed to pass through the barrier wall member. Thus, a desired type of processing such as ashing of the photoresist film present on the wafer W can be executed by using the hydrogen radicals.

It is to be noted that while an explanation is given above on an example in which the hydrogen plasma is generated in the plasma generation chamber 104 through the inductively coupled plasma method, the present invention is not limited to this example and hydrogen plasma may be generated instead through, for instance, a microwave excitation method.

As power is supplied to the heater element 124 as described above, infrared rays (radiant heat) originating from the heater element 124 are radiated downward onto a bottom 128 located below the stage 120 as well as the wafer W present above the stage 120. A shield plate is installed in order to block the infrared rays. If such a shield plate is installed with even a very small gap or the upright support 200 is constituted of quartz, through which infrared rays are transmitted, as in the related art, the infrared rays will reach the bottom 128 to heat the bottom area, which may then cause thermal damage to components disposed at the bottom 128.

Accordingly, the substrate stage achieved in the embodiment includes an outer heat shield plate 220 and an inner heat shield plate 230, such as those shown in FIG. 1, which are disposed without forming any gap in a plan view, so as to completely shield the bottom 128 from the infrared rays (radiant heat) directed toward the bottom. As a result, the extent to which the temperature increases at the bottom 128 is minimized and the components disposed on the bottom are detected from thermal damage. Examples of specific structures that may be adopted in the substrate stage which includes such shield plate are now described.

Substrate Stage Achieved in the First Embodiment

A specific structural example that may be adopted in the substrate stage in the first embodiment is now described. The substrate stage includes the stage 120 upon which the wafer is placed and the upright support 200 that ranges upright from the bottom 128 of the processing chamber 102 and supports the stage 120. The upright support 200 is constituted of a material assuring a high level of heat resistance, which does not induce metal contamination, e.g., quartz.

The upper end of the upright support 200 is fixed to the lower surface of the stage 120, whereas its lower end is fixed to the bottom 128 of the processing chamber 102. More specifically, a flange portion 208 formed at the lower end of the upright support 200 is clamped with a clamp 134 and is thus locked. Namely, as the clamp 134 is fixed onto the bottom portion 120 via a fastening means such as bolts 136, the lower end of the upright support 200, clamped via a clamp 134, becomes locked onto the bottom 128. As a result, the upright support 200 is installed so as to range upright at a predetermined position of the bottom 128.

The space between the lower end of the upright support 200 and the bottom 128 is sealed with an O-ring 132. More specifically, the O-ring 132 is disposed in a ring-shaped groove 130 formed at the bottom 128 so as to surround the opening at the lower end of the upright support 200 (the lower end opening of a large tube portion 204 in this example). Then, as the large tube portion 204 is mounted at the bottom portion 128, the large tube portion is clamped with the clamp 134, so as to apply pressure to the O-ring 132. Thus, the space between the outer space and the inner space present at the upright support 200 becomes sealed via the O-ring 132.

Figure 2:
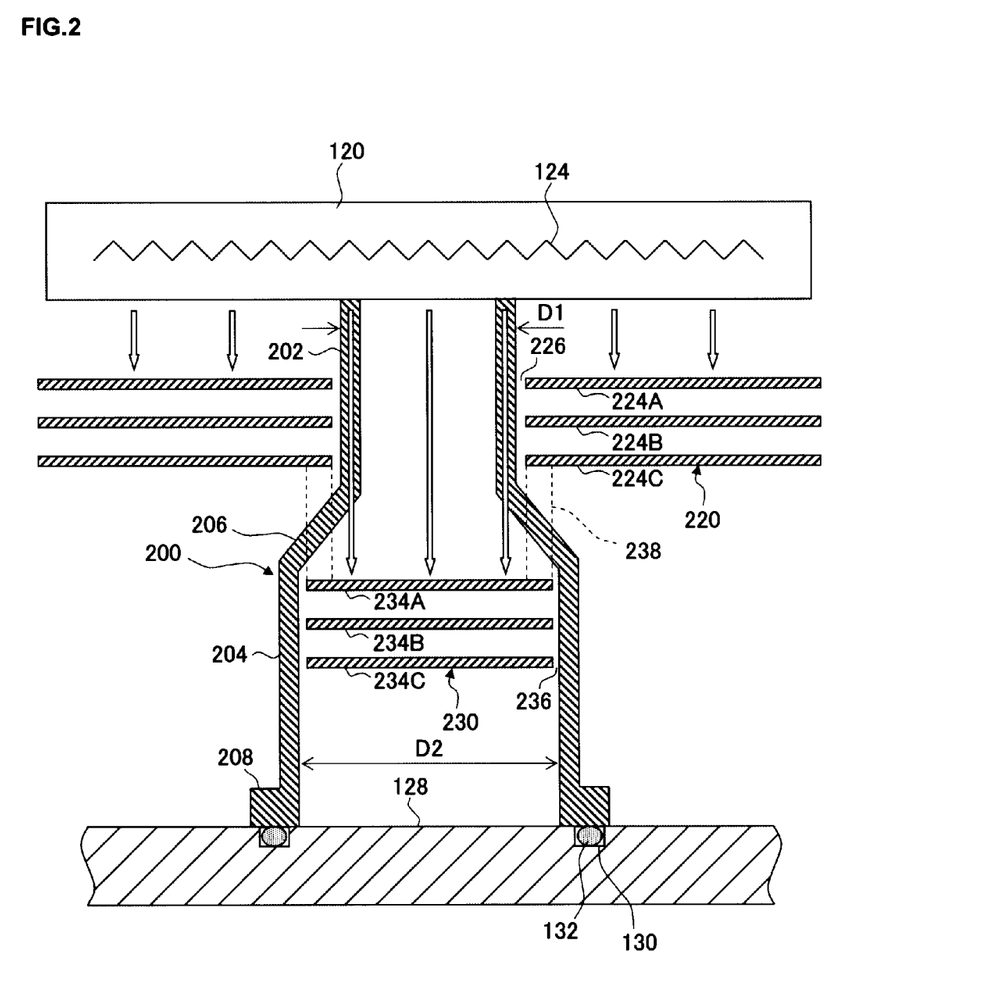
FIG. 2 is an enlarged sectional view schematically illustrating the structure of the upright support supporting the substrate stage in the embodiment.
Figure 3:
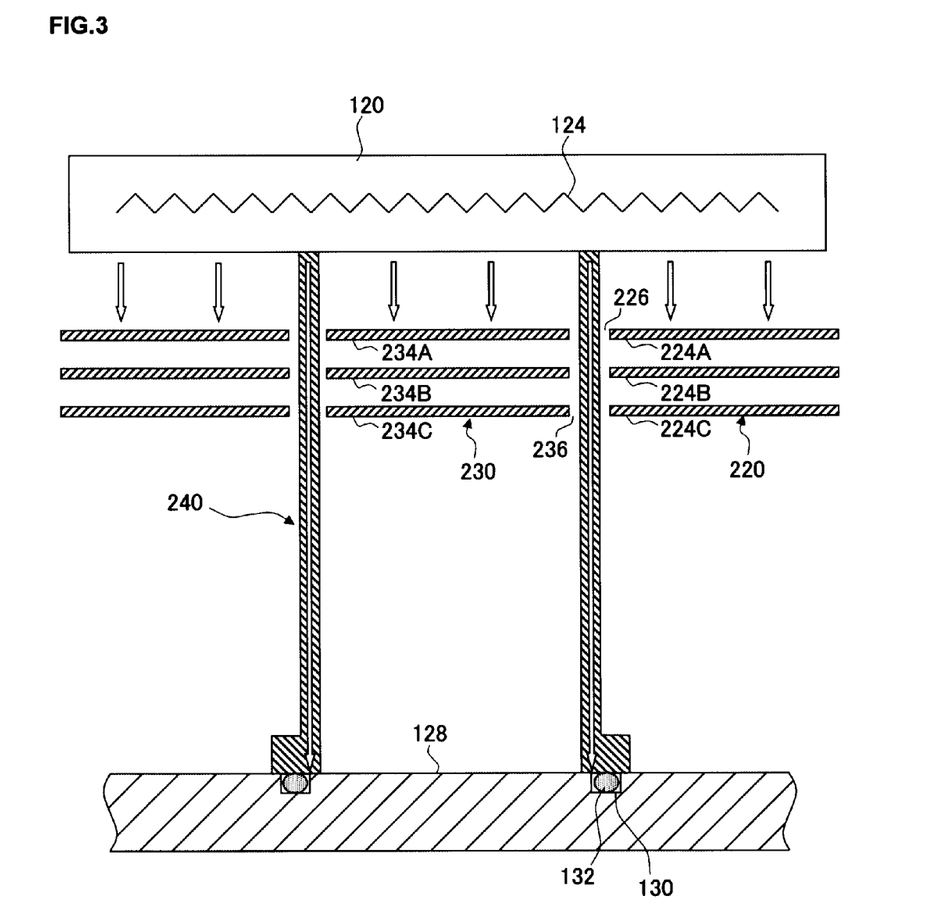
FIG. 3 is an enlarged sectional view schematically illustrating the structure of an upright support supporting the substrate stage presented for purposes of comparison.

In reference to drawings, the structure adopted in the upright support 200 at the substrate stage in the first embodiment and the positional arrangement with which an outer heat shield plate 220 and an inner heat shield plate 230 are disposed in the first embodiment are described in comparison with a reference example. FIG. 2 presents an enlarged sectional view of the stage in the first embodiment, which is supported on an upright support constituted with a tubular member the diameter of which is altered in the middle area thereof. FIG. 3 shows the stage in the reference example in an enlarged view. In the reference example, the stage is supported on an upright support constituted with a tubular member having a uniform diameter. FIGS. 2 and 3 each illustrate the structures of the upright support, the outer heat shield plate and the inner heat shield plate and the positional arrangement with which they are disposed. It is to be noted that for purposes of simplification, neither FIG. 2 nor 3 includes illustrations of the clamp 134, the bolts 136, a locking member 222 used to lock the outer heat shield plate 220, a locking member 232 used to lock the inner heat shield plate 230 and the like (neither do FIGS. 4 through 7 to be referred to later).

The upright support 200 in FIG. 2 is constituted with a tubular member (e.g., a cylindrical member) that includes a small tube portion 202, the large tube portion 204 assuming an inner diameter D2 greater than an outer diameter D1 of the small tube portion 202 and a middle portion 206 present between the small tube portion and the large tube portion. In this example, the small tube portion 202 is set at an upper position at the upright support 200, with the large tube portion 204 set at a lower position with the middle portion 206 present between them. However, the positions of the small tube portion 202 and the large tube portion 204 may be reversed.

The upright support 200 in this example is formed through integral molding and thus, the small tube portion 202, the middle portion 206 and the large tube portion 204 are formed as an integrated unit. Such an integrated unit may be formed by, for instance, trimming a single tubular member or executing a flame treatment on a single tubular member. Through such a forming process, a large tube portion 204 with the inner diameter D2 thereof greater than the outer diameter D1 of the small tube portion 202 is formed and the middle portion 206 connecting an end (the lower end in this example) of the small tube portion 202 and an end (the upper end in this example) of the large tube portion 204 and ranging continuously in a tapered shape at the outer circumference of the small tube portion 202, is formed. By forming the tubular member constituting the upright support 200 so as to assume a continuous tapered shape over the middle portion 206 thereof, as described above, the upright support can be manufactured as an integrated unit with ease.

A ring-shaped outer heat shield plate 220 is disposed under the stage 120 so as to surround the outer side of the small tube portion 202 and face opposite the lower surface of the stage 120. The outer heat shield plate 220 blocks infrared rays (radiant heat) originating from the heater element 124 on the outer side of the small tube portion 202. The outer heat shield plate 220 may be constituted with a single plate or it may be formed by stacking a plurality of plates one on top of another. The outer heat shield plate constituted with a plurality of plates should include a plurality of (e.g., 3) outer heat shield plates 224A, 224B and 224C, stacked one on top of another with a clearance formed between them, as shown in FIG. 2. The outer heat shield plate 220 is locked onto the lower surface of the stage 120 via the locking member 222, as shown in FIG. 1.

It is desirable that the outer heat shield plates 224A, 224B and 224C assume a shape and, in particular, a contour along the inner edges thereof, that matches the outer contour of the small tube portion 202. For instance, the outer heat shield plates 224A, 224B and 224C should assume a ring shape in conjunction with a small tube portion 202 formed in a cylindrical shape. In addition, the outer heat shield plate 220 may be a reflector that reflects infrared rays (radiant heat) or it may be an absorber that absorbs infrared rays (radiant heat).

Further down from the stage 120, a disk-shaped inner heat shield plate 230 is disposed so as to close off the inner side of the large tube portion 204 and face opposite the lower surface of the stage 120. The inner heat shield plate 230 blocks the infrared rays (radiant heat) originating from the heater element 124 on the inner side of the large tube portion 204. The inner heat shield plate 230 may be constituted with a single plate or a plurality of plates stacked one on top of another. The inner heat shield plate constituted with a plurality of plates should include a plurality (e.g., 3) of outer heat shield plates 234A, 234B and 234C, stacked one on top of another with a clearance formed between them, as shown in FIG. 2. The inner heat shield plate 230 is locked onto, for instance, the bottom 128 via a locking member 232.

It is desirable that the inner heat shield plates 234A, 234B and 234C assume a shape and, in particular, a contour along the outer edges thereof, that matches the inner contour of the large tube portion 204. For instance, the inner heat shield plates 234A, 234B and 234C should assume a disk shape in conjunction with a large tube portion 204 formed in a cylindrical shape. In addition, the inner heat shield plate 230 may be a reflector that reflects infrared rays (radiant heat) or it may be an absorber that absorbs infrared rays (radiant heat), as in the case of the outer heat shield plate 220.

It is desirable that the outer heat shield plate 220 and the inner heat shield plate 230 be disposed so that the inner edge of the outer heat shield plate 220 and the outer edge of the inner heat shield plate 230 overlap along the entire circumference in a plan view taken from the direction extending from the stage 120 toward the bottom 128 of the processing chamber 102. By adopting such a positional arrangement, the infrared rays (radiant heat) from the heater element 124 can be thoroughly blocked.

More specifically, the outer heat shielding plates 224A, 224B and 224C are disposed so as to set their inner edges in close proximity to the outer wall of the small tube portion 202 by minimizing a clearance 226 between the heat shield plates and the small diameter portion 202 of the upright support 200, whereas the inner heat shield plates 234A, 234B and 234C are disposed so that their outer edges are set in close proximity to the inner wall of the large tube portion 204 by minimizing a clearance 236 between the heat shield plates and the large tube portion 204 of the upright support 200, as shown in FIG. 2. By constituting the upright support 200 with a tubular member having the small tube portion 202 and the large tube portion 204 so as to alter the diameter of the upright support 200 over a middle area thereof, installing the outer heat shield plate 220 on the outer side of the small tube portion 202 and installing the inner heat shield plate 230 on the inner side of the large tube portion 204, an overlapped area 238, where the inner edge of the outer heat shield plate 220 and the outer edge of the inner heat shield plate 230 overlap along the entire circumference in a plan view can be formed.

By creating such an overlapped area 238, passage of infrared rays (indicated by unfilled arrows in FIG. 2) originating from the heater element 124 through the space between the outer heat shield plate 220 and the inner heat shield plate 230 is prevented.

More specifically, infrared rays traveling from the stage 120 toward the bottom 128 are blocked at the outer heat shield plate 220 in the space outside the upright support 200 and are blocked at the inner heat shield plate 230 inside the upright support 200. In addition, infrared rays that have passed through the clearance 226 without becoming blocked at the outer heat shield plate 220 advance primarily through rectilinear propagation and are subsequently blocked at the inner heat shield plate 230. At this time, most of the infrared rays transmitted through the great wall thickness area of the small tube portion 202 advance in rectilinear propagation and are then blocked at the inner heat shield plate 230.

At the substrate stage described above in reference to FIG. 2, the infrared rays radiated from the heating element 124 and directed toward the bottom 128 of the processing chamber 102 from the stage 120 are completely blocked by the outer heat shield plate 220 and the inner heat shield plate 230.

In contrast, the stage is supported on an upright support 240 constituted with a tubular member (cylindrical member) the diameter of which remains unchanged at the substrate stage in the reference example presented in FIG. 3. In this structure, the inner edge of the outer heat shield plate 220 and the outer edge of the inner heat shield plate 230 cannot be set to overlap and significant clearances 226 and 236 are formed even if the inner edge of the outer heat shield plate 220 and the outer edge of the inner heat shield plate 230 are set in close proximity to the wall of the upright support 240. As a result, some of the infrared rays traveling toward the bottom 128 will pass through the clearances 226 and 236 and will actually reach the bottom 128.

In addition, any infrared rays transmitted through the great wall thickness area of the upright support 240 will directly reach the bottom 128 through an end of the great wall thickness portion of the upright support 240. The infrared rays having reached the bottom area will raise the temperature at the bottom 128 and, as a result, any components constituted of a material with a low level of heat resistance among the components installed at the bottom are likely to be adversely affected by the heat. For instance, an O-ring 132 constituted of a material that does not withstand heat very well is likely to become degraded. As the O-ring 132 becomes degraded by the heat, a gas leak is bound to occur between the upright support 240 and the bottom 128 as the processing chamber 102 is evacuated, making it impossible to achieve the intended degree of vacuum inside the processing chamber 102. Since the O-ring 132 is often disposed over an area directly under the upright support 240, as shown in the illustration of the reference example, infrared rays will reach the O-ring readily to raise its temperature and lower its quality.

Apart from the O-ring 132, some of the components disposed at the bottom 128 are constituted of materials with poor heat resistance. Such components include a thermostat (temperature sensor), a motor and their electrical wiring. While these components may be disposed in a specific area of the bottom 128, where infrared rays do not reach directly, the bottom 128 may be constituted of a material with a high coefficient of thermal conductivity such as aluminum. In such a case, heat will be conducted over the entire bottom 128, raising the temperatures at the individual components to levels exceeding the rated tolerances.

While the temperature increase at the bottom 128 may be inhibited by lengthening the upright support 240, such a measure will necessitate an increase in the size of the processing chamber 102 and is thus not desirable. In addition, while a cooling mechanism (not shown) may be installed at the bottom 128, the installation will raise the manufacturing cost and is not, therefore, desirable.

At the substrate stage shown in FIG. 2, infrared rays originating from the heater element 124 and directed toward the bottom 128 of the processing chamber 102 can be completely blocked via the outer heat shield plate 220 and the inner heat shield plate 230, as described above. Thus, unnecessary heat application to the bottom 128 of the processing chamber 102 can be prevented without having to adjust the length of the upright support 200 supporting the stage 120. Ultimately, since the temperature increase at the bottom 128 is inhibited, the components installed at the bottom 128 are not subjected to any thermal damage. In addition, since infrared rays are prevented from reaching the bottom 128 through a simple structure that does not include a cooling mechanism installed at the bottom 128, the manufacturing cost is minimized.

It is to be noted that depending upon the taper angle assumed at the middle portion 206, the surface roughness of the tubular member and the like, some of the infrared rays having passed through the gap 226 or some of the infrared rays transmitted through the large wall thickness area of the small tube portion 202 may be irregularly reflected instead of advancing in rectilinear propagation at the substrate stage shown in FIG. 2. However, the quantity of such infrared rays is very small and the quantity of infrared rays entering the large wall thickness area of the large tube portion 204 via the middle portion 206 is even smaller. In other words, the quantity of infrared rays entering the large wall thickness area of the large tube portion 204 via the middle portion 206 is very small and they are also attenuated before they reach the bottom 128 of the processing chamber 102. Thus, the bottom 128 of the processing chamber 102 will not be heated to a high temperature by such infrared rays.

The number of plates constituting the heat shield plates 220 and 230 in the embodiment may be other than three. For instance, if the infrared rays traveling from the stage 120 are intense, the number of plates used to constitute the outer heat shield plate 220 and the inner heat shield plate 230 may be increased, whereas if the infrared ray intensity is low, the number of plates used to constitute the heat shield plates may be reduced.

In addition, the number of heat shield plates used to constitute the outer heat shield plate 220 may be different from the number of heat shield plates used to constitute the inner heat shield plate 230. For instance, the outer heat shield plate 220 is exposed to a low pressure atmosphere and the inner heat shield plate 230 is exposed to atmospheric pressure during substrate processing executed by heating the stage 120. This pressure differential in the environments of the heat shield plates may be factored in and the inner heat shield plate 230 may be constituted with a greater number of heat shield plates.

In addition, the upright support 200 may adopt structures other than that shown in FIG. 2, as long as it is constituted with a tubular member that includes a small tube portion 202 and a large tube portion 204 ranging continuously via a middle portion 206 so that the inner edge of the outer heat shield plate 220 and the outer edge of the inner heat shield plate 230 can be set to overlap along the entire circumference in a plan view. Other structural examples for the tubular member used to constitute the upright support 200 are described in reference to the subsequent embodiments.

Substrate Stage Achieved in the Second Embodiment

Figure 4:
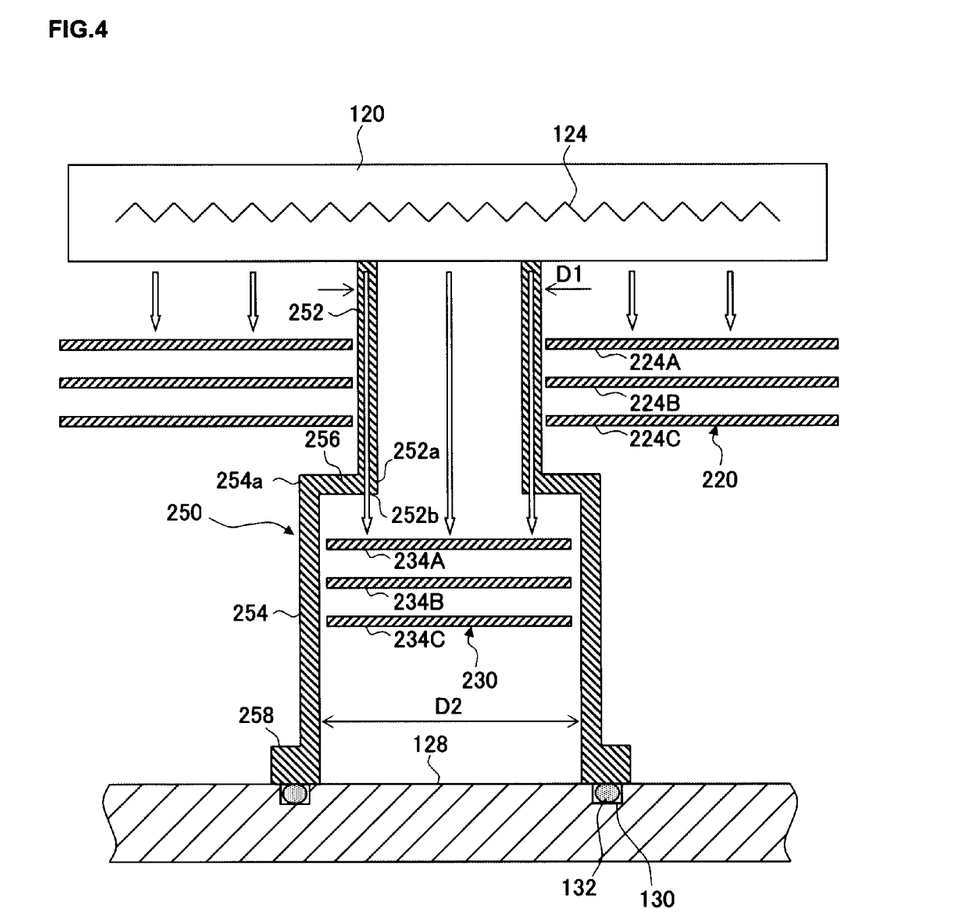
FIG. 4 is an enlarged sectional view schematically illustrating the structure adopted for the upright support supporting the substrate stage in a second embodiment.

In reference to a drawing, a structural example for the upright support at the substrate stage achieved as the second embodiment of the present invention is described. FIG. 4 is an enlarged sectional view schematically illustrating the structure of the substrate stage achieved in the second embodiment, which is similar to the enlarged sectional view presented in FIG. 2. The substrate stage in the plasma processing apparatus 100 in FIG. 1 may be replaced with the substrate stage achieved in the second embodiment. FIG. 4 shows the structures of the upright support, the outer heat shield plate and the inner heat shield plate and the positional arrangement with which they are disposed.

As shown in FIG. 4, an upright support 250 achieved in the second embodiment is constituted with a tubular member (e.g., a cylindrical member) that includes a small tube portion 252, a large tube portion 254 assuming an inner diameter D2 greater than an outer diameter D1 of the small tube portion and a middle portion 256 present between the small tube portion and the large tube portion. The upright support 250 in this example, too, is formed through integral molding and thus, the small tube portion 252, the middle portion 256 and the large tube portion 254 are formed as an integrated unit, as is the upright support 200 shown in FIG. 2.

The upright support 250 with the inner diameter D2 of the large tube portion 254 thereof set greater than the outer diameter D1 of the small tube portion 252 thereof, as in the case of the upright support 200 shown in FIG. 2, allows the inner edge of the outer heat shield plate 220 and the outer edge of the inner heat shield plate 230 to be set to overlap along the entire circumference.

By setting the inner edge of the outer heat shield plate 220 and the outer edge of the inner heat shield plate 230 to overlap as described above, infrared rays (indicated with unfilled arrows in FIG. 4) from the stage 120 are prevented from passing through any space between the outer heat shield plate 220 and the inner heat shield plate 230. As a result, infrared rays radiated from the heater element 124 and directed from the stage 120 toward the bottom 128 of the processing chamber 102 can be completely blocked by the outer heat shield plate 220 and the inner heat shield plate 230.

The middle portion 256 of the upright support 250 shown in FIG. 4 is formed so that an end (the lower end in this example) 252a of the small tube portion 252 and an end (the upper end in this example) 254a of the large tube portion 254 lie continuously along the horizontal direction on the outer side of the small tube portion 252 at the middle portion 256. In other words, the middle portion 256 ranges at a right angle to the axis of the small tube portion 252 and the large tube portion 254. By using a tubular member formed in such a shape to constitute the upright support 250, the upright support 250 can be formed as an integrated unit with ease.

At this upright support 250, most of the infrared rays directed from the stage 120 toward the bottom 128 and entering the great wall thickness area of the small tube portion 252 are radiated downward through rectilinear propagation through an end surface 252b. Namely, since the small tube portion 252 and the large tube portion 254 are set to range continuously via the horizontal middle portion at the outer circumference of the small tube portion 252, the middle portion 256 is set at a right angle to the small tube portion 252 and also at a right angle to the large tube portion 254. Thus, even if infrared rays enter the large wall thickness area of the small tube portion 252 from the stage 120, they cannot readily enter the large tube portion 254 via the middle portion 256 and instead, they are mostly transmitted downward through the end surface 252b of the small tube portion 252. Consequently, the inner heat shield plate 230 blocking the advance of the infrared rays further enhances the infrared ray blocking effect.

While the tubular member used to constitute the upright support in the first and second embodiments described above is an integrated unit that includes the small tube portion, the middle portion and the large tube portion, formed through integral molding, the present invention is not limited to this example and the tubular member to constitute an upright support may be formed by linking a small tube portion, a middle portion and a large tube portion each formed as an independent member. In this case, a tubular member assuming a complex shape that cannot be formed readily through integral molding can be obtained with ease. In reference to the third through fifth embodiment, specific examples in which the tubular member is formed by linking a small tube portion, a middle portion and a large tube portion, provided as separate members, are described.

Substrate Stage Achieved in the Third Embodiment

Figure 5:
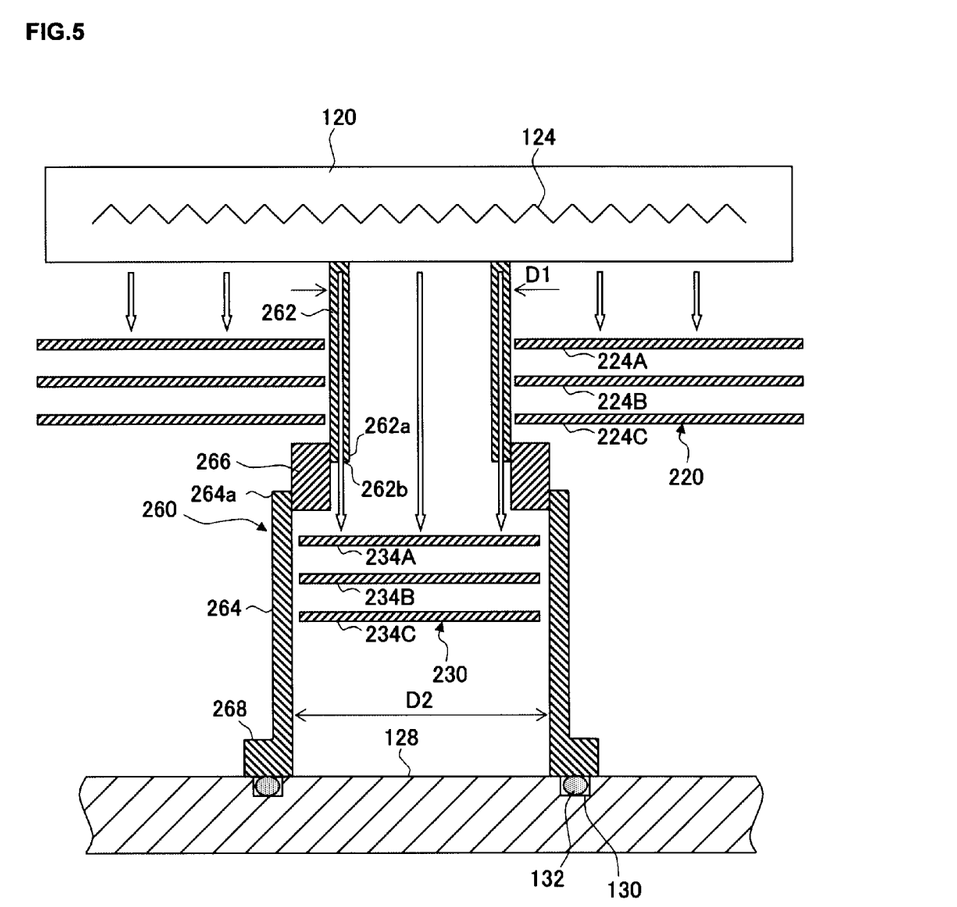
FIG. 5 is an enlarged sectional view schematically illustrating the structure adopted for the upright support supporting the substrate stage in a third embodiment.

In reference to a drawing, a structural example for the upright support at the substrate stage achieved as the third embodiment of the present invention is described. FIG. 5 is an enlarged sectional view schematically illustrating the structure of the substrate stage achieved in the third embodiment, which is similar to the enlarged sectional view presented in FIG. 2. The substrate stage in the plasma processing apparatus 100 in FIG. 1 may be replaced with the substrate stage achieved in the third embodiment. FIG. 5 shows the structures of the upright support, the outer heat shield plate and the inner heat shield plate and the positional arrangement with which they are disposed.

While the upright support 200 in FIG. 2 and the upright support 250 in FIG. 4 are each constituted with a tubular member formed as an integrated unit that includes a small tube portion, a middle portion and a large tube portion, an upright support 260 in FIG. 5 is constituted with a tubular member formed by connecting a member to constitute a small tube portion, a member to constitute a large tube portion and a member to constitute a middle portion, formed as separate members.

The upright support 260 in FIG. 5 is formed by combining a small diameter tubular member 262 to constitute the small tube portion, a large diameter tubular member 264 to constitute the large tube portion and a linking member 266 to constitute the middle portion. The linking member 266, formed in a cylindrical shape, links an end (the lower end in this example) 262a of the small diameter tubular member 262 to an end (the upper end in this example) 264a of the large diameter tubular member 264 with an offset along the vertical direction.

The upright support 260 shown in FIG. 5, with the inner diameter D2 of the large diameter tubular member 264 set greater than the outer diameter D1 of the small diameter tubular member 262, allows the inner edge of the outer heat shield plate 220 and the outer edge of the inner heat shield plate 230 to overlap along the entire circumference, as does the upright support 200 shown in FIG. 2. As a result, infrared rays radiated from the heater element 124 and directed toward the bottom 128 of the processing chamber 102 from the stage 120 can be completely blocked via the outer heat shield plate 220 and the inner heat shield plate 230, as in the first and second embodiments.

In addition, the upright support 260 can be manufactured with relative ease by simply forming the linking member 266 to constitute the middle portion in a cylindrical shape, inserting the linking member 266 between the outer side of the end (the lower end in this example) 262a of the small diameter tubular member 262 and the inner side of the end 264a of the large diameter tubular member 264 and fixing them together through welding or the like. Furthermore, since the linking member 266 can be manufactured simply by setting its outer diameter and inner diameter to match the inner diameter of the large diameter tubular member 264 and the outer diameter of the small diameter tubular member 262, fine dimensional adjustment is facilitated.

Since the outer side of the end 262a of the small diameter tubular member 262 is linked to the inner side of the end 264a of the large diameter tubular member 264 via the linking member 266, the end surface 262b of the end 262a at the small diameter tubular member 262 faces downward in an exposed state. For this reason, even infrared rays having entered the large wall thickness area of the small diameter tubular member 262 from the stage 120 cannot readily enter the large diameter tubular member 264 via the linking member 266, and instead, they are mostly transmitted downward through the end surface 262b of the small diameter tubular member 262. Thus, the inner heat shield plate 230 blocking the advance of the infrared rays further enhances the infrared ray blocking effect.

Substrate Stage Achieved in the Fourth Embodiment

Figure 6:
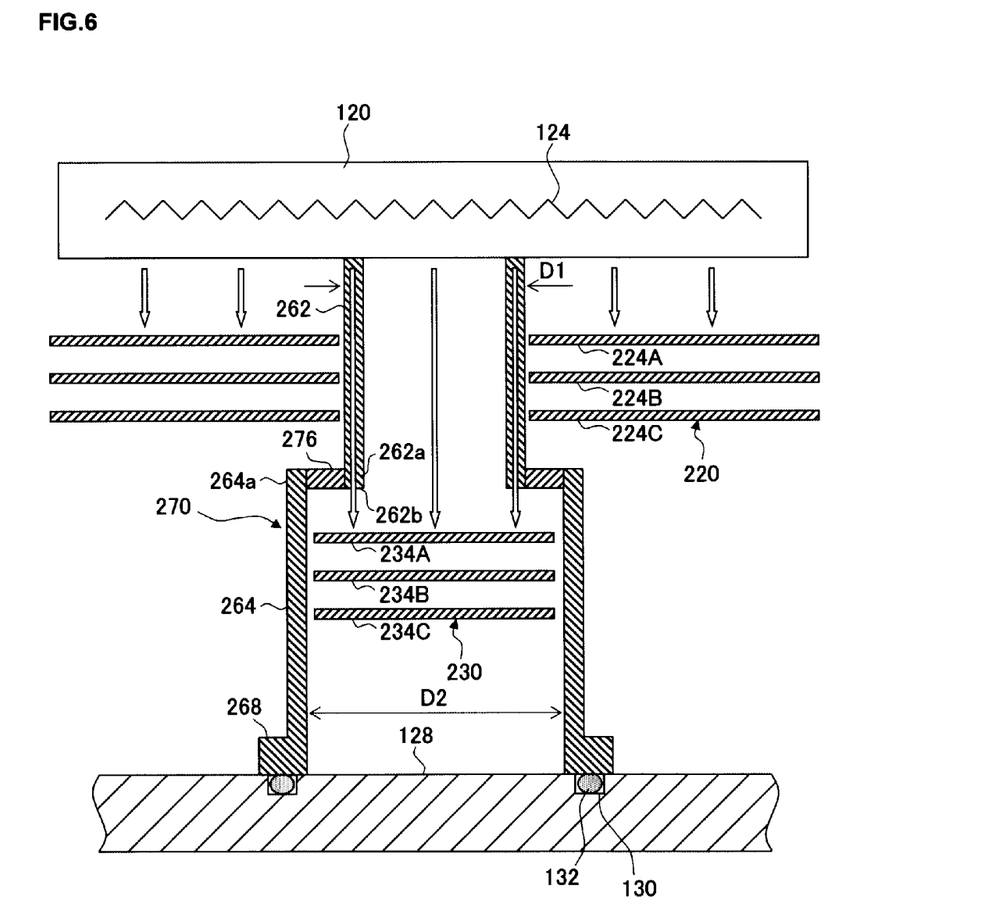
FIG. 6 is an enlarged sectional view schematically illustrating the structure adopted for the upright support supporting the substrate stage in a fourth embodiment.

In reference to a drawing, a structural example for the upright support at the substrate stage achieved as the fourth embodiment of the present invention is described. FIG. 6 is an enlarged sectional view schematically illustrating the structure of the substrate stage achieved in the fourth embodiment, which is similar to the enlarged sectional view presented in FIG. 2. The substrate stage in the plasma processing apparatus 100 in FIG. 1 may be replaced with the substrate stage achieved in the fourth embodiment. FIG. 6 shows the structures of the upright support, the outer heat shield plate and the inner heat shield plate and the positional arrangement with which they are disposed.

At an upright support 270 shown in FIG. 6, a small diameter tubular member 262 and a large diameter tubular member 264 are linked via a linking member 276 formed as a disk with a circular opening in the middle instead of the cylindrical linking member 266 shown in FIG. 5. The tubular member constituting the upright support 270 is thus similar to that constituting the upright support 250 in FIG. 4. As a result, advantages similar to those of the substrate stage shown in FIG. 4 are achieved.

In addition, the upright support 270 in FIG. 6 can be manufactured with relative ease simply by forming the linking member 276 as the middle portion in the shape of a hollow disk and fixing the outer side of the end 262a of the small diameter tubular member 262 to the inner side of the end 264a of the large diameter tubular member 264 via the linking member 276 through welding or the like. Furthermore, since the linking member 276 can be manufactured simply by setting its outer diameter and inner diameter to match the inner diameter of the large diameter tubular member 264 and the outer diameter of the small diameter tubular member 262, fine dimensional adjustment is facilitated.

Substrate Stage Achieved in the Fifth Embodiment

Figure 7:
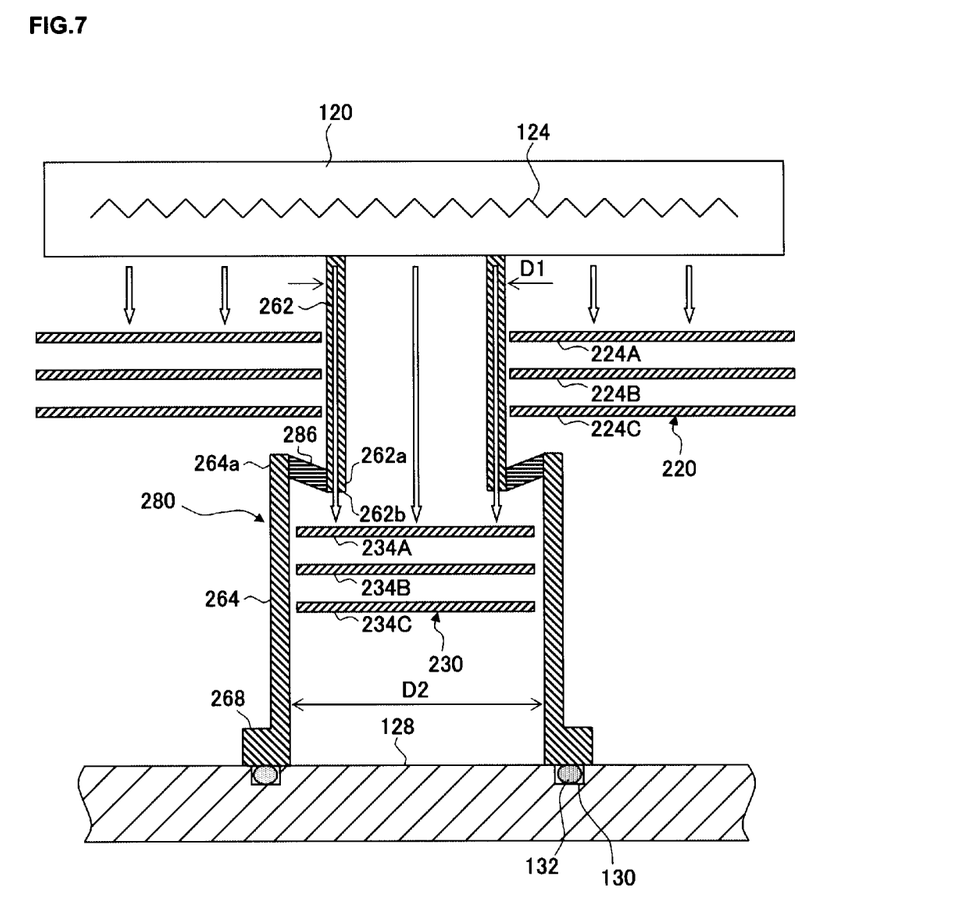
FIG. 7 is an enlarged sectional view schematically illustrating the structure adopted for the upright support supporting the substrate stage in a fifth embodiment.

In reference to a drawing, a structural example for the upright support at the substrate stage achieved as the fifth embodiment of the present invention is described. FIG. 7 is an enlarged sectional view schematically illustrating the structure of the substrate stage achieved in the fifth embodiment, which is similar to the enlarged sectional view presented in FIG. 2. The substrate stage in the plasma processing apparatus 100 in FIG. 1 may be replaced with the substrate stage achieved in the fifth embodiment. FIG. 7 shows the structures of the upright support, the outer heat shield plate and the inner heat shield plate and the positional arrangement with which they are disposed.

At an upright support 280 shown in FIG. 6, the end 262a of the small diameter tubular member 262 and the end 264a of the large diameter tubular member 264 are linked via a tapered linking member 286 instead of the cylindrical linking member 266 shown in FIG. 5. The linking member 286 is formed so that its diameter, relatively small at the end 262a of the small diameter tubular member 262 gradually increases as it ranges along the upward direction toward the end 264a of the large diameter tubular member 264. Such a linking member 286 links the small diameter tubular member 262 with the large diameter tubular member 264 with the outer side of the end (lower end) 262a of the small diameter tubular member 262 fitted inside the end (upper end) 264a of the large diameter tubular member 264.

The upright support 280 shown in FIG. 7, with the inner diameter D2 of the large diameter tubular member 264 set greater than the outer diameter D1 of the small diameter tubular member 262, allows the inner edge of the outer heat shield plate 220 and the outer edge of the inner heat shield plate 230 to overlap along the entire circumference, as does the upright support 200 shown in FIG. 2. As a result, infrared rays radiated from the heater element 124 and directed toward the bottom 128 of the processing chamber 102 from the stage 120 can be completely blocked via the outer heat shield plate 220 and the inner heat shield plate 230, as in the first and second embodiments.

In addition, the upright support in the fifth embodiment can be manufactured with relative ease simply by forming the linking member 286 to constitute the middle portion in a tapered shape and fixing the linking member 286 between the outer side of the end 262a of the small diameter tubular member 262 and the inner side of the end 264a of the large diameter tubular member 264 through welding or the like. Furthermore, since the linking member 276 can be manufactured simply by setting its outer diameter and inner diameter to match the inner diameter of the large diameter tubular member 264 and the outer diameter of the small diameter tubular member 262, fine dimensional adjustment is facilitated.

Moreover, the linking member 286 is formed so that its diameter, relatively small at the end 262a of the small diameter tubular member 262, gradually increases as it ranges along the upward direction toward the end 264a of the large diameter tubular member 264. For this reason, even infrared rays having entered the large wall thickness area of the small diameter tubular member 262 from the stage 120 cannot readily enter the large diameter tubular member 264 via the linking member 286, and instead, they are mostly transmitted downward through the end surface 262b of the small diameter tubular member 262. Thus, the inner heat shield plate 230 blocking the advance of the infrared rays further enhances the infrared ray blocking effect.

While an explanation is given in reference to the fifth embodiment on an example in which the diameter of the linking member 286, relatively small at the end of the small tube portion, gradually increases as it ranges along the upward direction toward the end of the large tube portion, the present invention is not limited to this example and instead, the linking member 286 may be formed so that its diameter, relatively small at the end of the small tube portion, gradually increases as it ranges along a downward direction toward the end of the large tube portion. A tubular member that includes such a linking member will achieve a shape similar to that of the upright support 200 shown in FIG. 2.

It is to be noted that the extent by which the inner edge of the outer heat shield plate 220 and the outer edge of the inner heat shield plate 230 overlap in the first through fifth embodiments may be adjusted depending upon whether or not there are any infrared rays traveling through the space between the inner edge of the outer heat shield plate and the outer edge of the inner heat shield plate or depending upon the quantity of such infrared rays passing through the space. The extent to which the inner edge and the outer edge overlap can be adjusted with ease simply by adjusting the diameter of the small tube portion and the diameter of the large tube portion. Namely, the extent of the overlap can be increased by assuring a greater difference between the diameter of the small tube portion and the diameter at the large tube portion, whereas the extent of the overlap can be reduced by setting a smaller difference between the diameter of the small tube portion and the diameter of the large tube portion.

While an explanation is given above in reference to the first through fifth embodiments on an example in which the upright support is formed so that its small tube portion assumes an upper position and its large tube portion assumes a lower position, the present invention is not limited to this example and the positional relationship between the small tube portion and the large tube portion in the first through fifth embodiments may be reversed so as to set the small tube portion at the lower position and the large tube portion at the upper position. This positional arrangement, too, allows the inner edge of the outer heat shield plate and the outer edge of the inner heat shield plate to overlap, so as to achieve an infrared ray blocking effect similar to that achieved in the first through fifth embodiments.

While the invention has been particularly shown and described with respect to preferred embodiments thereof by referring to the attached drawings, the present invention is not limited to these examples and it will be understood by those skilled in the art that various changes in form and detail may be made therein without departing from the spirit, scope and teaching of the invention.

What is claimed is:

1. A substrate processing apparatus that includes a substrate stage installed inside a processing chamber and executes a specific type of processing on a substrate placed on said substrate stage, wherein:
    said substrate stage comprises:
    a stage upon which the substrate is placed;
    a heater installed inside said stage and heats the substrate placed on said stage;
    an upright support that ranges upright from a bottom of said processing chamber to support said stage and comprises a tubular member that includes a small tube portion, a large tube portion assuming an inner diameter greater than the outer diameter of said small tube portion and a middle portion attached to and joining said small tube portion and said large tube portion to one another;
    an outer heat shield plate disposed so as to surround said small tube portion on an outer side thereof, and blocks the heat from said heater on said outer side of said small tube portion; and
    an inner heat shield plate disposed so as to block the heat from said heater on the inner side of said large tube portion; and
    said outer heat shield plate and said inner heat shield plate are disposed so that an inner edge of said outer heat shield plate and an outer edge of said inner heat shield plate overlap along the entire circumference, in a plan view taken from said stage.

2. A substrate processing apparatus according to claim 1, wherein:
    said tubular member is formed as single-piece unit that includes said small tube portion, said middle portion and said large tube portion through integral molding.

3. A substrate processing apparatus according to claim 1, wherein:
    said tubular member is formed by linking said small tube portion and said large tube portion via said middle portion.

4. A substrate processing apparatus according to claim 1, wherein:
    said middle portion links an end of said small tube portion and an end of said large tube portion continuously by ranging in a tapered shape further away from an outer circumference of said small tube portion.

5. A substrate processing apparatus according to claim 1, wherein:
    said middle portion links an end of said small tube portion and an end of said large tube portion by ranging continuously along a horizontal direction further away from an outer circumference of said small tube portion.

6. A substrate processing apparatus according to claim 1, wherein:
    said outer heat shield plates and said inner heat shield plate are each formed by stacking a plurality of heat shield plate one on top of another.

7. A substrate stage upon which a substrate to undergo a specific type of processing inside a processing chamber is placed, comprising:
    a stage upon which the substrate is placed;
    a heater installed inside said stage and heats the substrate placed on said stage;
    a upright support that ranges upright from a bottom of said processing chamber to support said stage and comprises a tubular member that includes a small tube portion, a large tube portion assuming an inner diameter greater than an outer diameter of said small tube portion and a middle portion attached to and joining said small tube portion and said large tube portion to one another;
    an outer heat shield plate disposed so as to surround said small tube portion on an outer side thereof, and blocks the heat from said heater on the outer side of said small tube portion; and
    an inner heat shield plate disposed so as to block the heat from said heater on the inner side of said large tube portion, wherein:
    said outer heat shield plate and said inner heat shield plate are disposed so that an inner edge of said outer heat shield plate and an outer edge of said inner heat shield plate overlap along an entire circumference, in a plan view taken from said stage.

* * * * *